United States Patent
Iio et al.

(10) Patent No.: US 10,035,897 B2
(45) Date of Patent: Jul. 31, 2018

(54) DIELECTRIC FILM, PROCESS FOR PRODUCING SAME, AND TRANSDUCER USING SAME

(71) Applicant: Sumitomo Riko Company Limited, Aichi (JP)

(72) Inventors: Shinji Iio, Aichi-ken (JP); Shigeaki Takamatsu, Aichi-ken (JP); Shunsuke Taniguchi, Aichi-ken (JP); Yota Kokubo, Aichi-ken (JP); Hitoshi Yoshikawa, Aichi-ken (JP); Jun Kobayashi, Aichi-ken (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 239 days.

(21) Appl. No.: 15/202,818

(22) Filed: Jul. 6, 2016

(65) Prior Publication Data

US 2016/0312002 A1 Oct. 27, 2016

Related U.S. Application Data

(62) Division of application No. 13/201,508, filed as application No. PCT/JP2010/065200 on Sep. 6, 2010, now abandoned.

(30) Foreign Application Priority Data

Sep. 18, 2009 (JP) .................................. 2009-217208
Mar. 19, 2010 (JP) .................................. 2010-064002

(51) Int. Cl.
| | |
|---|---|
| C08K 5/00 | (2006.01) |
| C08K 3/36 | (2006.01) |
| C08K 5/098 | (2006.01) |
| H02N 1/00 | (2006.01) |
| H01L 41/37 | (2013.01) |
| H01L 41/18 | (2006.01) |
| C08J 3/20 | (2006.01) |
| C08J 3/24 | (2006.01) |
| H02N 1/08 | (2006.01) |
| H04R 7/02 | (2006.01) |

(52) U.S. Cl.
CPC .............. *C08K 5/0091* (2013.01); *C08J 3/20* (2013.01); *C08J 3/24* (2013.01); *C08K 3/36* (2013.01); *C08K 5/098* (2013.01); *H01L 41/183* (2013.01); *H01L 41/37* (2013.01); *H02N 1/006* (2013.01); *H02N 1/08* (2013.01); C08J 2313/00 (2013.01); H04R 7/02 (2013.01); H04R 2307/025 (2013.01); H04R 2307/027 (2013.01); Y10T 428/31931 (2015.04)

(58) Field of Classification Search
CPC .................................................. C08K 5/0091
USPC ........................................................ 524/566
See application file for complete search history.

(56) References Cited

U.S. PATENT DOCUMENTS

| | | | |
|---|---|---|---|
| 5,508,336 A | 4/1996 | Takeichi | |
| 6,477,029 B1 | 11/2002 | Sharma et al. | |
| 6,876,125 B2 | 4/2005 | Basheer et al. | |
| 2002/0010258 A1 | 1/2002 | Bowen et al. | |
| 2003/0143804 A1* | 7/2003 | Ito | H01L 21/76801 438/250 |
| 2003/0219588 A1* | 11/2003 | Ogawa | H01L 23/49894 428/308.4 |
| 2004/0013858 A1* | 1/2004 | Hacker | H01L 21/02063 428/195.1 |
| 2004/0143050 A1 | 7/2004 | Gatti et al. | |
| 2006/0041096 A1 | 2/2006 | Shin et al. | |
| 2007/0003753 A1 | 1/2007 | Asgari | |
| 2008/0227913 A1 | 9/2008 | Koide | |

(Continued)

FOREIGN PATENT DOCUMENTS

| | | |
|---|---|---|
| JP | 2001-524278 | 11/2001 |
| JP | 3295023 | 4/2002 |
| JP | 2003-505865 | 2/2003 |

(Continued)

OTHER PUBLICATIONS

Official Communication issued in European Patent Office Counterpart Patent App. No. 10 817 069.7, dated Jan. 3, 2017.
Yoshikawa et al., JP 2009-296703, Dielectric film and method of manufacturing the same, and actuator, sensor and transducer using the same, Dec. 17, 2009 (Machine Translation).
Yamamoto, Akio and Shu Kambara, Structures of the Reaction Products of Tetraalkoxytitanium with Acetylacetone and Ethyl Acetoacetate, Journal of the American Chemical Society 1957 79 (16), 4344-4348.

(Continued)

*Primary Examiner* — Doris L Lee
(74) *Attorney, Agent, or Firm* — Greenblum & Bernstein, P.L.C.

(57) ABSTRACT

A dielectric film which has high electrical resistance and excellent durability and a process for producing the dielectric film are provided. Also provided is a transducer which has large displacement and excellent durability. The dielectric film includes a three-dimensional crosslinked body that is synthesized from an organic metal compound, a rubber polymer that is other than a polydimethyl siloxane and has a functional group that is reactive with the organic metal compound, and an inorganic filler that has a functional group that is reactive with the organic metal compound. The transducer is configured by interposing the dielectric film between at least a pair of electrodes. The dielectric film may be produced by preparing a first solution that contains a rubber polymer and an inorganic filler in a solvent that is capable of dissolving the rubber polymer and of chelating an organic metal compound, then preparing a second solution by mixing the organic metal compound into the first solution, and then removing the solvent from the second solution to allow a crosslinking reaction to proceed.

17 Claims, 5 Drawing Sheets

(56) References Cited

U.S. PATENT DOCUMENTS

2009/0186977 A1 7/2009 Nagamori et al.
2011/0068417 A1 3/2011 Murase

FOREIGN PATENT DOCUMENTS

| JP | 2006-236837 | 9/2006 |
|---|---|---|
| JP | 2007-264581 | 10/2007 |
| JP | 2008-120644 | 5/2008 |
| JP | 2009-500054 | 1/2009 |
| JP | 2009-120698 | 6/2009 |
| JP | 2009/173691 | 8/2009 |
| JP | 2009-296703 | 12/2009 |
| WO | 98/35529 | 8/1998 |
| WO | 01/06575 | 1/2001 |

OTHER PUBLICATIONS

Hamanaka et al., JP 11-080373, "Ceramic Composite Rubber and its Production", Mar. 26, 1999 (Machine Translation).
Machine Translation of JP 2009-120698 (2009).
Machine Translation of JP 2008-120644 (2008).
Search report from International Application No. PCT/JP2010/065200, dated Nov. 9, 2010.
International Preliminary Report on Patentability for PCT/JP2010/065200, dated Apr. 11, 2012.
Search report from E.P.O. Application No. 10817069.7., dated Apr. 25, 2014.

* cited by examiner

[FIG. 1]
(a)
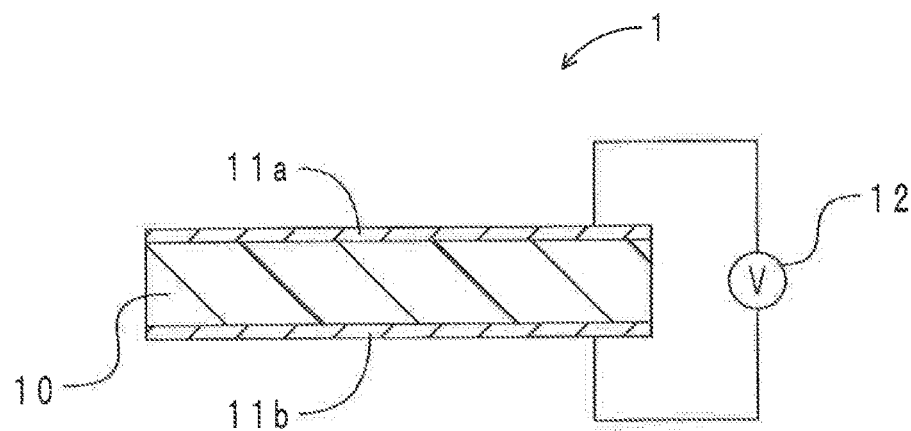
VOLTAGE OFF
(b)
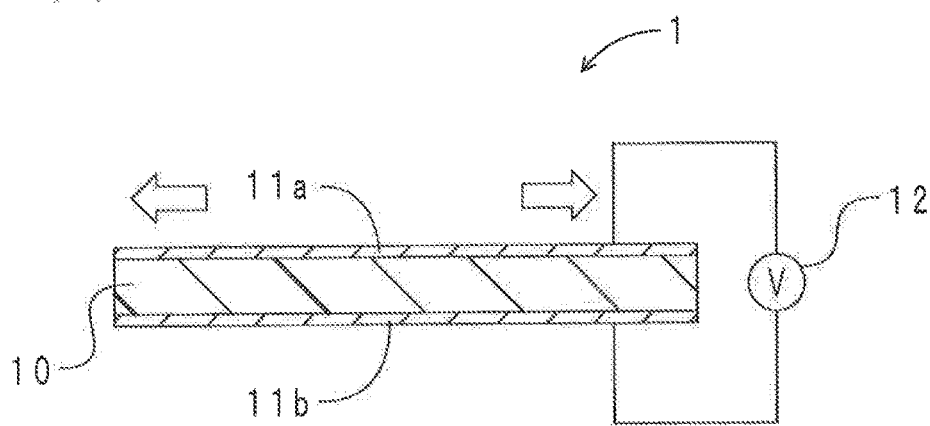
VOLTAGE ON

[FIG. 2]
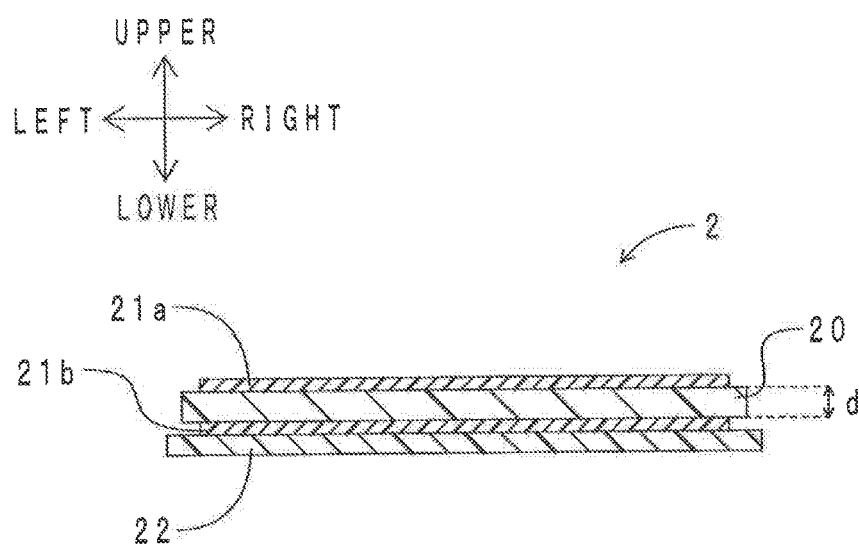

[FIG. 3]
(a) EXPANDED STATE
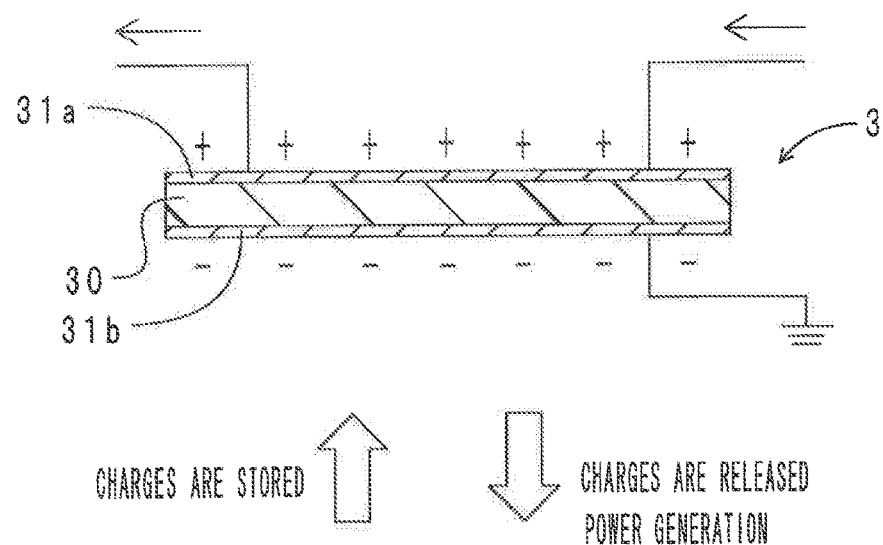
CHARGES ARE STORED ⇧  ⇩ CHARGES ARE RELEASED POWER GENERATION
(b) CONTRACTED STATE
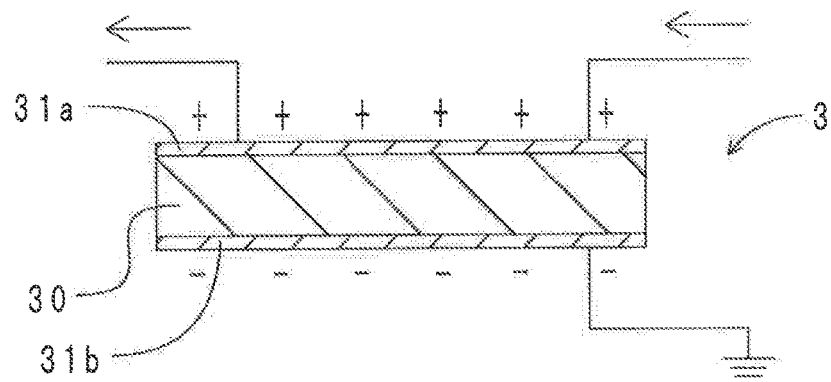

[FIG. 4]
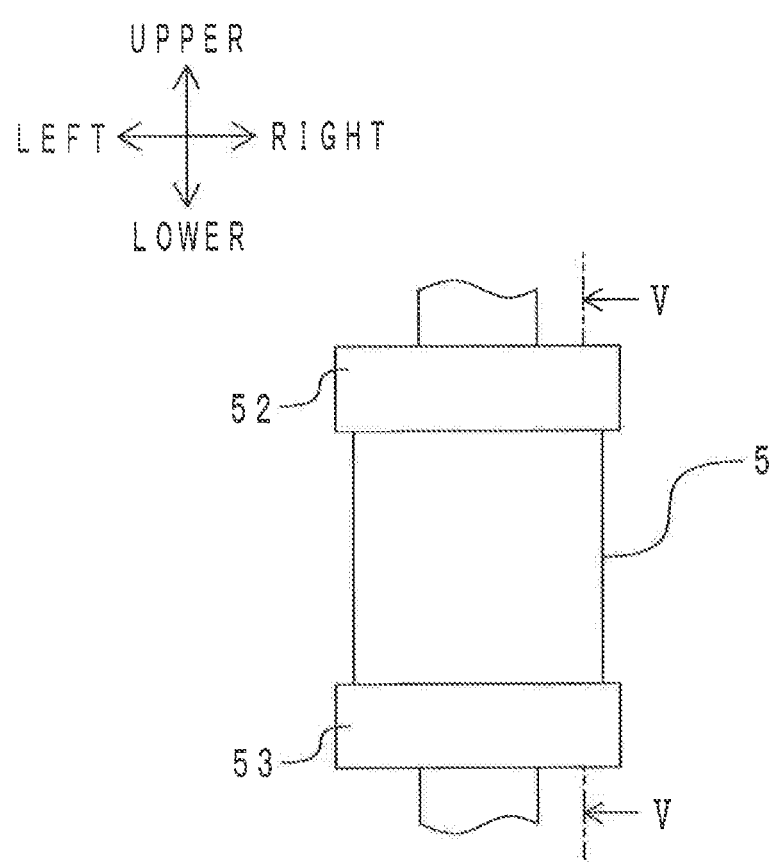

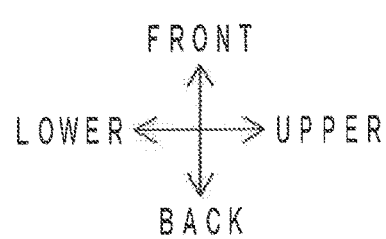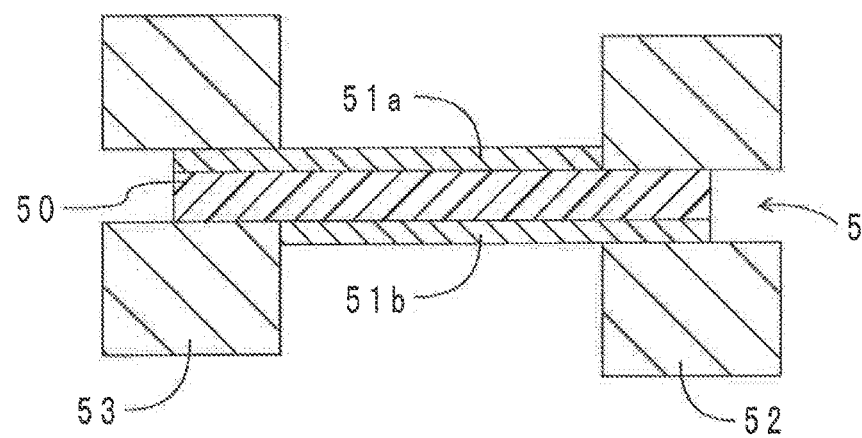
[FIG. 5]

DIELECTRIC FILM, PROCESS FOR PRODUCING SAME, AND TRANSDUCER USING SAME

CROSS-REFERENCE TO RELATED APPLICATIONS

This application is a Divisional of U.S. application Ser. No. 13/201,508, filed Aug. 15, 2011, which is the National Stage of the International Application No. PCT/JP2010/065200, filed Sep. 6, 2010, which claims priority to Japanese Application Nos. 2009-217208, filed Sep. 18, 2009, and 2010-064002, filed Mar. 19, 2010. The disclosure of application Ser. No. 13/201,508 and PCT/JP2010/065200 are expressly incorporated by reference herein in their entireties.

TECHNICAL FIELD

The present invention relates to a dielectric film that is suited for use in transducers such as actuators and sensors, to a process for producing the same, and to a transducer using the same.

BACKGROUND ART

Transducers can be actuators, sensors, electric power generation elements, etc. that perform conversion between mechanical energy and electrical energy. Alternatively, transducers can be speakers, microphones, etc. that perform conversion between acoustic energy and electrical energy. Polymer materials such as dielectric elastomers are useful for configuring transducers that are high in flexibility, small in size and light in weight.

An actuator may be configured by, for example, arranging a pair of electrodes on both thickness direction sides of a dielectric film that is formed of a dielectric elastomer. In an actuator of this type, electrostatic attractive force between the electrodes increases with an increase of the voltage that is applied between the electrodes, so that the dielectric film that is sandwiched between the electrodes is compressed in the thickness direction and the thickness thereof is reduced. As a result of the reduction of the film thickness, the dielectric film correspondingly expands in the direction parallel with the electrode plane. When the voltage that is applied between the electrodes is reduced, on the other hand, electrostatic attractive force decreases so that the compressive force that is acted on the dielectric film in the thickness direction is reduced and the thickness thereof increases as a result of the elastic restoring force thereof. As a result of the increase of the film thickness, the dielectric film correspondingly contracts in the direction parallel with the electrode plane. Thus, the actuator can drive an object to be driven by the expansion and contraction of the dielectric film. As the dielectric film material, silicone rubbers, acrylic rubbers, nitrile rubbers, urethane rubbers, etc. are used (see, for example, Patent Documents 1 and 2).

PRIOR ART DOCUMENTS

Patent Documents

[Patent Document 1] Published Japanese Translation of PCT application 2003-505865

[Patent Document 2] Published Japanese Translation of PCT application 2001-524278

[Patent Document 3] Japanese Patent No. 3295023

SUMMARY OF THE INVENTION

Problem to be Solved by the Invention

Since a silicone rubber, for example, has a skeletal structure that is composed of siloxane bonds, the electric resistance thereof is high. For this reason, a dielectric film made of such a silicone rubber hardly undergoes dielectric breakdown even when a high voltage is applied thereto. A polydimethylsiloxane-based silicone rubber, on the other hand, has low polarity, namely has a small dielectric constant. Therefore, when an actuator is configured using a dielectric film that is composed of such a polydimethylsiloxane-based silicone rubber, the electrostatic attractive force for an applied voltage is so small that sufficient force and displacement are not obtainable.

On the other hand, when an actuator is configured using a dielectric film that has a large dielectric constant, it is possible to store a large amount of charges in a boundary between the dielectric film and each electrode. It follows that the electrostatic attractive force for an applied voltage is large. For example, known acrylic rubber and nitrile rubber have a larger dielectric constant than silicone rubber and, therefore, are suited as a dielectric film. However, the electric resistance of acrylic rubber, etc. is smaller than that of silicone rubber. Therefore, when acrylic rubber or the like rubber is used as a dielectric film, a current unavoidably flows through the dielectric film when an applied voltage is high. Hence, charges are not sufficiently accumulated in the film. Thus, in spite of the fact that acrylic rubber or the like rubber has a large dielectric constant, the electrostatic attractive force decreases so that it is impossible to obtain a sufficient force and displacement. Further, when a current flows through the dielectric film, there is a possibility that the dielectric film is broken down due to the generated Joule heat. Furthermore, there arises an additional problem that the dielectric film undergoes dielectric breakdown due to its small electric resistance.

The present invention has been made in view of the foregoing circumstances and is aimed at the provision of a dielectric film that has a large electric resistance and is excellent in durability and of a method for producing the same. It is also an object of the present invention to provide a transducer that uses such a dielectric film and that has large displacement and excellent durability.

Means for Solving the Problem (1) A dielectric film according to the present invention is a dielectric film that is to be interposed between at least a pair of electrodes of a transducer. The dielectric film is characterized by including a three-dimensional crosslinked body that is synthesized from an organic metal compound, a rubber polymer which is other than a polydimethyl siloxane and has a functional group which is reactive with the organic metal compound, and an inorganic filler which has a functional group that is reactive with the organic metal compound.

The above-mentioned Patent Document 3 discloses a ceramic composite rubber in which a rubber polymer and an organic metal compound that has an organic functional group which is reactive with the rubber polymer are chemically bonded to each other. The ceramic composite rubber does not contain an inorganic filler that is capable of forming a three-dimensional crosslinked body. Namely, in the ceramic composite rubber, a metal oxide that is produced by hydrolysis of an unreacted organic metal compound is merely dispersed in the rubber.

In contrast to this, the three-dimensional crosslinked body of the present invention contains an inorganic filler. Further, each of the rubber polymer and inorganic filler has a functional group that is capable of reacting with the organic metal compound. Therefore, during synthesis of the three-dimensional crosslinked body, reactions occur between the rubber polymer and the organic metal compound and between the inorganic filler and the organic metal compound, so that they are chemically bonded to each other. Thus, the three-dimensional crosslinked body of the present invention has such a structure in which the rubber polymer is crosslinked with the organic metal compound and the inorganic filler is incorporated in the thus formed crosslinkage.

In the three-dimensional crosslinked body of the present invention, flow of electrons is interrupted by the inorganic filler as well as by the metal oxide that is derived from the organic metal compound. Accordingly, the electric resistance of the three-dimensional crosslinked body is high. Namely, the electric resistance of the dielectric film of the present invention is high. Therefore, when a voltage is applied between a pair of electrodes between which the dielectric film of the present invention is interposed, an electric current does not easily flow through the dielectric film. For this reason, a large amount of charges can be stored in the dielectric film. As a consequence, electrostatic attractive force increases so that large force and displacement are obtainable in, for example, an actuator.

In addition, because an electric current does not easily flow through the dielectric film, generation of Joule heat is suppressed. For this reason, there is low possibility that the dielectric film of the present invention is thermally broken down. Additionally, the dielectric film of the present invention, which has a high electric resistance, does not easily undergo insulation breakdown. Thus, the dielectric film of the present invention has excellent durability. Moreover, it is possible to apply a higher voltage to the dielectric film of the present invention. Therefore, with the dielectric film of the present invention, large force and displacement are obtainable in, for example, an actuator.

The dielectric film of the present invention uses a rubber polymer that is other than polydimethylsiloxane. Namely, the film uses a rubber polymer that has higher polarity, in other words, a larger dielectric constant, than that of the conventionally employed polydimethylsiloxane-type silicone rubber. Therefore, with the dielectric film of the present invention, large electrostatic attractive force is generated even when an applied voltage is relatively low. As a consequence, a desired force and displacement are obtainable in, for example, an actuator that uses the dielectric film of the present invention.

(2) A process for producing a dielectric film according to the present invention, the process being suited for the production of the above-described dielectric film according to the present invention, includes a first solution preparing step that prepares a first solution that contains the rubber polymer, the inorganic filler and, optionally the plasticizer in a solvent that is capable of dissolving the rubber polymer and of chelating the organic metal compound, a second solution preparing step that prepares a second solution by mixing the organic metal compound into the first solution, and a crosslinking step that removes the solvent from the second solution to allow a crosslinking reaction to proceed.

The organic metal compound hydrolyzes by reaction with water and is polycondensed by dehydration or dealcoholation (sol-gel reaction) to form a three-dimensional crosslinked body. The organic metal compound is generally highly reactive with water and difficult to handle. In the production process according to the present invention, it is possible, by chelating the organic metal compound, to suppress abrupt reaction thereof with water. Namely, in the production process of the present invention, the solvent not only can dissolve the rubber polymer and disperse the inorganic filler but also serves to act as a chelating agent.

In the second solution preparing step, when the organic metal compound is mixed into the first solution, in which the rubber polymer is dissolved and the inorganic filler is dispersed, the organic metal compound in the solution is chelated. Thus, the hydrolysis of the organic metal compound is suppressed. In the succeeding crosslinking step, the solvent is removed. Namely, the chelating agent is removed. As a result, the dealcoholation of the organic metal compound is accelerated so that the crosslinking by polycondensation proceeds.

Thus, with the production process of the present invention, the reaction speed of the organic metal compound can be lowered. Therefore, it is possible to obtain a homogeneous dielectric film. Further, since the solvent serves to function both as a solvent for dissolving the rubber polymer and dispersing the inorganic filler and as a chelating agent, it is not necessary to separately prepare a solvent and a chelating agent. Therefore, the production step is simplified and is practical. In the first solution preparing step, a first solution, in which the rubber polymer is dissolved and the inorganic filler is dispersed, is previously prepared. Consequently, the dispersibility of the inorganic filler in the second solution is improved so that a homogeneous dielectric film is obtainable. Incidentally, a plasticizer may be mixed as needed. Namely, the plasticizer may be or may not be contained in the first solution.

(3) A transducer of the present invention is characterized by including the above-described dielectric film according to the present invention, and a plurality of electrodes that are arranged via the dielectric film The transducer of the present invention includes the above-described dielectric film of the present invention. As described previously, the dielectric film of the present invention has a high electric resistance and, therefore, can store a large amount of charges. For this reason, when the transducer of the present invention is used, for example, as an actuator, large force and displacement can be obtained. Further, there is low possibility that the dielectric film of the present invention is thermally broken down. Additionally, the dielectric film does not easily undergo insulation breakdown. Thus, the dielectric film of the present invention has excellent durability.

BRIEF DESCRIPTION OF THE DRAWINGS

FIG. 1 is schematic cross-sectional view of an actuator which is a first embodiment of a transducer according to the present invention, wherein (a) shows an OFF state and (b) shows an ON state.

FIG. 2 is schematic cross-sectional view of a capacitive sensor which is a second embodiment of a transducer according to the present invention.

FIG. 3 is schematic cross-sectional view of an electric power generation element which is a third embodiment of a transducer according to the present invention, wherein (a) shows an expanded state and (b) shows a contracted state.

FIG. 4 is a front view of an actuator that is mounted on an experimental device.

FIG. 5 is a V-V cross-sectional view of FIG. 4.

DESCRIPTION OF THE REFERENCE NUMERALS

1: actuator (transducer), 10: dielectric film, 11a, 11b: electrodes, 12: power source;
2: capacitive sensor (transducer), 20: dielectric film, 21a, 21b: electrodes, 22: substrate;
3: electric power generation element (transducer), 30: dielectric film, 31a, 31b: electrodes;
5: actuator, 50: dielectric film, 51a, 51b: electrodes; 52: upper chuck, 53: lower chuck

DESCRIPTION OF EMBODIMENTS

Embodiments of the dielectric film, production process thereof and transducer according to the present invention will be described below. It should be noted that the dielectric film, production process thereof and transducer according to the present invention are not limited to the following specific embodiments but may be embodied in various forms that can be modified or improved by those skilled in the art without departing from the gist of the present invention.

<Dielectric Film>

The dielectric film of the present invention includes a three-dimensional crosslinked body that is synthesized from an organic metal compound, a rubber polymer that has a functional group which is reactive with the organic metal compound and which is other than a polydimethyl siloxane, and an inorganic filler that has a functional group which is reactive with the organic metal compound.

(1) Organic Metal Compound

The kind of the organic metal compound is not specifically limited. The organic metal compound may be liquid or solid. Examples of the organic metal compound include metal alkoxide compounds, metal acylate compounds and metal chelate compounds. One compound that is selected from these compounds may be used singly. Alternatively, two or more of these compounds may be used in combination. It is desired that the organic metal compound contains at least one element that is selected from the group consisting of titanium, zirconium, aluminum, silicon, boron, vanadium, manganese, iron, cobalt, germanium, yttrium, niobium, lanthanum, cerium, tantalum, tungsten and magnesium.

The metal alkoxide compound is represented, for example, by the following general formula (a):

$$M(OR)_m \qquad (a)$$

[In the formula (a), M represents an atom such as a metal, R represents at least one of $C_1$ to $C_{10}$ alkyl groups, aryl groups and alkenyl groups and may be the same or different, and m is a valency of the atom M which is a metal or the like element].

The metal alkoxide compound may also be a polymer that has two or more recurring units of $[(MO)_n$ where n is an integer of 2 or more] in the molecule thereof. By changing the number n, it is possible to control compatibility with the rubber polymer, reaction speed, etc. of the metal alkoxide compound. It is advisable, therefore, to select a suitable polymer depending on the kind of the rubber polymer.

Examples of the atom M such as a metal include titanium, zirconium, aluminum, silicon, iron, copper, tin, barium, strontium, hafnium and boron. Particularly, at least one atom that is selected from titanium, zirconium and aluminum is preferably contained for reasons of good reactivity. Specific examples of suitable metal alkoxide include tetra-n-butoxy titanium, tetra-n-butoxy zirconium, tetra-n-butoxy silane, acetoalkoxy aluminum diisopropylate, tetra-i-propoxy titanium, tetraethoxy silane, tetrakis(2-ethylhexyloxy) titanium and titanium butoxide dimer.

Examples of the metal acylate compound include polyhydroxy titanium stearate and zirconium tributoxy monostearate.

Examples of the metal chelate compound include titanium chelate compounds such as titanium diisopropoxy-bis(acetylacetonate), titanium tetraacetylacetonate, titanium dioctyloxy-bis(octylene glycolate), titanium diisopropoxy-bis(ethylacetoacetate), titanium diisopropoxy-bis(triethanolaminate) and titanium dibutoxy-bis(triethanolaminate) and zirconium chelate compounds such as zirconium tetraacetylacetonate, zirconium tributoxy monoacetylacetonate, zirconium monobutoxy acetylacetonate-bis(ethylacetoacetate) and zirconium dibutoxy-bis(ethylacetoacetate).

(2) Rubber Polymer

The rubber polymer is other than polydimethylsiloxane and has a functional group that is capable of reacting with the organic metal compound. The rubber polymer may be liquid or solid. Examples of the functional group that is capable of reacting with the organic metal compound include a carboxyl group (—COOH), a hydroxyl group (—OH), an amino group (—NH), an amide (—CONR$_1$R$_2$), an epoxy group, a thiol (—SH) and an ester (R$_3$C(=O)OR$_4$). It is preferred that the rubber polymer has one or more of these functional groups.

It is desirable to use a rubber polymer that has high polarity, namely a high dielectric constant, from the standpoint of obtaining large displacement using a small applied voltage. For example, a rubber polymer that has a dielectric constant of 2.8 or more (measuring frequency of 100 Hz) is preferable. Examples of the rubber polymer that has a high dielectric constant include acrylonitrile-butadiene copolymers (NBR), hydrogenated nitrile rubbers (H—NBR), acrylic rubbers, urethane rubbers, fluorine rubbers, fluorosilicone rubbers, chlorosulfonated polyethylene rubbers, chloroprene rubbers, ethylene-vinyl acetate copolymers and chlorinated polyethylenes. It is desired that these rubbers be used singly or as a mixture of two or more thereof. It is also preferred that the rubber polymer have an unsaturated main chain because of its less tendency to cause insulation breakdown even when applied with a high voltage and of its weatherability.

(3) Inorganic Filler

The inorganic filler has a functional group that is capable of reacting with the organic metal compound. Examples of the functional group that is capable of reacting with the organic metal compound include a hydroxyl group (—OH), a carboxyl group (—COOH), an amino group (—NH), an amide (—CONR$_1$R$_2$), an epoxy group, a thiol (—SH) and an ester (R$_3$C(=O)OR$_4$), which are similar to the case of the rubber polymer. It is preferred that the inorganic filler have one or more of these functional groups. The inorganic filler may be subjected to a surface treatment to increase the number of the functional groups. By so doing, the reactivity of the inorganic filler with the metal alkoxide can be improved.

Examples of the inorganic filler include silica, titanium oxide, barium titanate, calcium carbonate, clay and talc. In particular, silica is preferably used because the number of its functional groups is large and because it is relatively inexpensive.

There is a possibility that ionic impurities that remain in the inorganic filler may reduce the electric resistance of the dielectric film. It is, therefore, desired that an inorganic filler that has as small an amount of ionic impurities as possible is used. For example, silica that has been produced by certain methods may contain sodium that is derived from the raw material. When such sodium remains present in a large amount, there is a possibility that sodium ions cause a reduction of the electric resistance. Here, the residual amount of sodium is related to the pH of silica. Namely, the pH value tends to increase with an increase of the residual amount of sodium. Therefore, when silica is used, it is desirable to choose silica that has as low a pH value as possible. For example, a pH value of 10.5 or less is suitable. The pH value is desirably 8.5 or less, more desirably 6.5 or less. As used herein, the term "pH value" is intended to mean a value that is measured by the following method. Silica is first dispersed in water to prepare a dispersion that has a silica concentration of 4% by mass. After dispersion is sufficiently stirred, the pH value of the dispersion is measured with a pH meter.

(4) Other Additives

In the production of the three-dimensional crosslinked body of the present invention, a catalyst, a reinforcing agent, a plasticizer, an age resister, a coloring agent, etc. may be mixed therein in addition to the organic metal compound, rubber polymer and inorganic filler. For example, addition of a plasticizer can improve the flexibility of the produced three-dimensional crosslinked body, namely the flexibility of the dielectric film of the present invention. As a consequence, the dielectric film of the present invention can be easily stretched. When the plasticizer is incorporated into the film, it is possible to obtain larger force and displacement in an actuator, for example.

From the standpoint of its less tendency to reduce the electric resistance of the dielectric film, the plasticizer to be mixed is preferably one which is highly insulative and is sparingly volatile. Examples of suitable plasticizers include tricresyl phosphate, tris(2-ethylhexyl) trimellitate, chlorinated paraffin, tris(n-octyl) trimellitate, tris(isononyl) trimellitate, tris(isodecyl) trimellitate, dipentaerythritol esters and octyl esters of pyromellitic acid.

<Production Process for Dielectric Film>

The production process for the dielectric film of the present invention is not specifically limited. The dielectric film may be produced by, for example, the methods that are shown in (1) and (2) below.

(1) In a first method, a rubber polymer, an inorganic filler and an organic metal compound are kneaded with rolls or a kneader (kneading step), and the kneaded product is formed into a thin film under predetermined conditions (film forming step).

(2) In a second method, a first solution that includes a solvent in which a rubber polymer and an inorganic filler are contained is first prepared (first solution preparing step). Into the first solution, an organic metal compound, either as such or as a solution in a predetermined solvent, is mixed so as to prepare a second solution (second solution preparing step). Thereafter, the second solution is applied to a substrate and dried under predetermined conditions (film forming step).

In the second method, the rubber polymer and inorganic filler may be previously kneaded with rolls or a kneader, and the resulting kneaded mixture is subsequently added to the solvent to prepare the first solution. By previously kneading the rubber polymer together with the inorganic filler, the dispersibility of the inorganic filler is improved. Alternatively, the first solution may be prepared by mixing a solution of the rubber polymer in a solvent with a dispersion of the inorganic filler in a solvent.

When the organic metal compound in the form of a solution in a predetermined solvent is mixed, this solvent may be the same as or different from the solvent that is used in the preparation of the first solution. In the first method, a catalyst, a reinforcing agent, a plasticizer, an age resister, a coloring agent, etc. may be added in the kneading step as needed. In the second method, a catalyst, a reinforcing agent, a plasticizer, an age resister, a coloring agent, etc. may be added in the first solution preparing step and second solution preparing step, as needed.

A mixing amount of the organic metal compound is preferably 0.5 part by mass or more and 40 parts by mass or less per 100 parts by mass of the rubber polymer. When the amount is less than 0.5 part by mass, crosslinking does not proceed sufficiently so that the three-dimensional crosslinked body is not easily produced. The mixing amount is preferably 1.5 parts by mass or more. When the amount exceeds 40 parts by mass, on the other hand, crosslinking excessively proceeds so that there is a possibility that the dielectric film becomes hard and the flexibility thereof is deteriorated. The mixing amount is preferably 30 parts by mass or less.

A mixing amount of the inorganic filler is preferably 1 part by mass or more and 40 parts by mass or less per 100 parts by mass of the rubber polymer. When the amount is less than 1 part by mass, flow of electrons cannot be sufficiently interrupted so that the effect of increasing the electric resistance is small. The mixing amount is preferably 5 parts by mass or more. When the amount exceeds 40 parts by mass, on the other hand, there is a possibility that the dielectric film becomes hard and the flexibility thereof is deteriorated. The mixing amount is preferably 30 parts by mass or less.

When the plasticizer is mixed, the mixing amount thereof is preferably 1 part by mass or more and 200 parts by mass or less per 100 parts by mass of a total amount of the rubber polymer and the organic metal compound. When the amount is less than 1 part by mass, the effect of improving the flexibility is low. The mixing amount is preferably 5 parts by mass or more. When the mixing amount exceeds 200 parts by mass, on the other hand, there is a possibility that the compatibility of the plasticizer with the rubber component is deteriorated and bleeding occurs. The mixing amount is preferably 150 parts by mass or less.

The organic metal compound reacts with water in the air or in the reaction system (rubber polymer, solution) to undergo hydrolysis and polycondensation (sol-gel reaction). It is, therefore, desirable to use the organic metal compound in a chelated form using a chelating agent in order to suppress abrupt reaction with water and to form a homogeneous film. In particular, a metal alkoxide compound has high reactivity and, hence, is desired to be used in a chelated form. A metal acylate compound, on the other hand, is not so reactive as compared with the metal alkoxide compound and, therefore, the necessity for chelating is low.

When the organic metal compound is used in a chelated form, it is advisable to adopt, for example, the following method. A first solution that includes a predetermined solvent in which the rubber polymer and the inorganic filler are contained is first prepared (first solution preparing step). Into the first solution, an organic metal compound in a chelated form is mixed so as to obtain a second solution (second solution preparing step). Thereafter, the second solution is applied to a substrate and dried under predetermined conditions to remove the chelating agent and to allow a crosslinking reaction to proceed (crosslinking step). By these steps, a dielectric film in the form of a thin film is produced.

Examples of the chelating agent include β-diketones such as acetyl acetone, benzoyl acetone and dibenzoylmethane, β-keto acid esters such as ethyl acetoacetate and ethyl benzoylacetate, triethanolamine, lactic acid, 2-ethylhexane-1,3-diol and 1,3-hexanediol. The chelating agent is desirably used in an amount of 10 parts by mass or more and 100,000 parts by mass or less per 100 parts by mass of the organic metal compound. When the amount is less than 10 parts by mass, the organic metal compound cannot be sufficiently chelated. The mixing amount is preferably 50 parts by mass or more. When the amount exceeds 100,000 parts by mass, it becomes difficult to remove the chelating agent and, therefore, the drying, for example, must be performed excessively. The mixing amount is preferably 8,000 parts by mass or less.

When the rubber polymer is capable of being dissolved in the chelating agent, it is possible to use the chelating agent as a solvent for the rubber polymer. In this case, it is advisable to adopt the following method, for example. A first solution that contains the rubber polymer and the inorganic filler in a solvent that is capable of dissolving the rubber polymer and of chelating the organic metal compound is first prepared (first solution preparing step). Then, the organic metal compound is mixed into the first solution to prepare a second solution (second solution preparing step). Thereafter, the solvent is removed from the second solution to allow a crosslinking reaction to proceed (crosslinking step).

The solvent may consist only of the chelating agent or may be a mixture of the chelating agent and other solvent. In the crosslinking step, it is only necessary to apply the second solution to a substrate and dry it. By so doing, a dielectric film in the form of a thin film may be produced. A temperature of the crosslinking step may be appropriately determined according to the type of solvent in consideration of the reaction speed, etc. For example, room temperature may be employed. However, a temperature that is not lower than the boiling point of the solvent may be desirably used. When the organic metal compound in a chelated form is used, a catalyst, a reinforcing agent, a plasticizer, an age resister, a coloring agent, etc. may be added in the first solution preparing step and second solution preparing step. In one specific embodiment in which a plasticizer is used, the production process for the dielectric film may include the following three steps. At first, a first solution that contains the rubber polymer, the inorganic filler and the plasticizer in a solvent that is capable of dissolving the rubber polymer and of chelating the organic metal compound is prepared (first solution preparing step). Then, the organic metal compound is mixed into the first solution to prepare a second solution (second solution preparing step). Thereafter, the solvent is removed from the second solution to allow a crosslinking reaction to proceed (crosslinking step).

<Transducer>

The transducer of the present invention includes the dielectric film according to the present invention, and a plurality of electrodes that are arranged via the dielectric film. The constitution and process for production of the dielectric film of the present invention are as described above and the description thereof is omitted here. In the transducer of the present invention, it is desired that the preferred embodiments of the dielectric film of the present invention be also employed.

A thickness of the dielectric film may be appropriately determined according to, for example, the intended use thereof. For example, when the transducer of the preset invention is used as an actuator, it is preferred that the thickness of the transducer be thin from the standpoint of compactness of the actuator, capability of driving at a low voltage, large displacement, etc. In this case, also in consideration of insulation breakdown, it is desired that the thickness of the dielectric film be 1 μm or more and 1,000 μm (1 mm) or less, more preferably 5 μm or more and 200 μm or less.

In the transducer of the present invention, the material for the electrode is not specifically limited. It is possible to use, for example, an electrode that is obtainable by applying a paste or paint which is a mixture of: an electrically conductive material formed by a carbonaceous material, such as carbon black or carbon nanotubes, or a metal; and a binder such as oil or an elastomer. Alternatively, an electrode may be used that is obtainable by weaving a carbonaceous material or a metal into mesh. It is desired that the electrode be expandable/contractible in conformity with the expansion/contraction of the dielectric film. When the electrode is expanded/contracted together with the dielectric film, deformation of the dielectric film is not disturbed by the electrode. As a consequence, when the transducer of the present invention is used as an actuator, for example, desired displacement may be easily achieved.

When the transducer of the present invention is designed such that a plurality of the dielectric films and electrodes are alternately laminated, it is possible to generate larger force. Therefore, when such a laminated structure is employed, a high output of an actuator, for example, can be obtained. By this, a member to be driven can be driven with a larger force.

First Embodiment

As a first example of the transducer of the present invention, description will be made of an embodiment embodying an actuator. FIG. 1 shows a cross-sectional schematic view of an actuator of the first embodiment, in which (a) shows an OFF state and (b) shows an ON state.

As shown in FIG. 1, the actuator 1 includes a dielectric film 10 and electrodes 11a and 11b. The dielectric film 10 is a three-dimensional crosslinked body (dielectric film of the present invention) that has been synthesized from tetrakis (2-ethylhexyloxy) titanium (metal alkoxide compound), hydrogenated nitrile rubber that has carboxyl groups (rubber polymer) and silica (inorganic filler). The electrodes 11a and 11b are fixed to upper and lower sides of the dielectric film 10, respectively. The electrodes 11a and 11b are connected to a power source 12 through wires. The actuator is turned from the OFF state to the ON state when a voltage is applied between the paired electrodes 11a and 11b. Upon the application of the voltage, the thickness of the dielectric film 10 is reduced and, therefore, correspondingly expands in the direction parallel with the planes of the electrodes 11a and 11b as shown by the white arrows in FIG. 1(b). Thus, the actuator 1 can output driving forces in the up-down direction and left-right direction.

Here, the electric resistance of the dielectric film 10 is high. When a high voltage is applied between the electrodes 11a and 11b, therefore, an electric current does not easily flow through the dielectric film 10. For this reason, a large amount of charges can be stored in the dielectric film 10. As a consequence, large electrostatic attractive force is generated so that large force and displacement are obtainable. In addition, because an electric current does not easily flow through the dielectric film 10, generation of Joule heat is suppressed. For this reason, there is low possibility that the dielectric film 10 is thermally broken down. Additionally, the dielectric film 10 does not easily undergo insulation breakdown. Thus, the actuator 1 has excellent durability. Incidentally, insulation breakdown strength of the dielectric film 10 is improved when the dielectric film 10 is arranged in the state where it is stretched in the surface-extending direction thereof. In this case, since it is possible to apply a higher voltage, large force and displacement are obtainable.

Second Embodiment

As a second example of the transducer of the present invention, description will be made of an embodiment embodying a capacitive sensor. FIG. 2 shows a cross-sectional schematic view of a capacitive sensor of the second embodiment. As shown in FIG. 2, the capacitive sensor 2 includes a dielectric film 20, electrodes 21a and 21b and a substrate 22. The dielectric film 20 is a three-dimensional crosslinked body (dielectric film of the present invention) that has been synthesized from tetrakis(2-ethylhexyloxy) titanium (metal alkoxide compound), hydrogenated nitrile rubber that has carboxyl groups (rubber polymer) and silica (inorganic filler). The dielectric film 20 is in the form of a strip that extends in the left-right direction. The dielectric film 20 is disposed on an upper surface of the substrate 22 via the electrode 21b. The electrodes 21a and 21 b are each in the form of a strip that extends in the left-right direction. The electrodes 21a and 21b are fixed to upper and lower sides of the dielectric film 20, respectively. The electrodes 21a and 21b are connected to wires (not shown). The substrate 22 is an insulative flexible film and is in the form of a strip that extends in the left-right direction. The substrate 22 is fixed to a lower side of the electrode 21b.

The capacitance of the capacitive sensor 2 may be determined from the following equation (I):

$$C = \varepsilon_0 \varepsilon_r S/d \qquad (I)$$

[C: capacitance. $\varepsilon_0$: dielectric constant in vacuum, $\varepsilon_r$: relative dielectric constant of the dielectric film, S: area of electrode, d: inter-electrode distance].

When the capacitive sensor 2 is pressed from above, for example, the dielectric film 20 is compressed and is correspondingly expanded in the direction parallel with the planes of the electrodes 21a and 21b. When the film thickness, namely the inter-electrode distance d is reduced, the capacitance between the electrodes 21a and 21b increases. The amount and position of the applied load may be thus detected by the change in the capacitance.

Here, the electric resistance of the dielectric film 20 is high. Therefore, even when the capacitance between the electrodes 21a and 21b becomes high as a result of application of a large compression force, an electric current does not easily flow through the dielectric film 20. For this reason, it is possible to precisely detect the amount and position of the applied load. In addition, because an electric current does not easily flow through the dielectric film 20, generation of Joule heat is suppressed. For this reason, there is low possibility that the dielectric film 20 is thermally broken down. Further, the dielectric film 20 does not easily undergo insulation breakdown. Thus, the capacitive sensor 2 has excellent durability.

Third Embodiment

As a third example of the transducer of the present invention, description will be made of an embodiment embodying an electric power generation element. FIG. 3 shows a cross-sectional schematic view of an electric power generation element of the third embodiment, in which (a) shows an expanded state and (b) shows a contracted state. As shown in FIG. 3, the electric power generation element 3 includes a dielectric film 30 and electrodes 31a and 31b. The dielectric film 30 is a three-dimensional crosslinked body (dielectric film of the present invention) that has been synthesized from tetrakis(2-ethylhexyloxy) titanium (metal alkoxide compound), hydrogenated nitrile rubber that has carboxyl groups (rubber polymer) and silica (inorganic filler). The electrodes 31a and 31b are fixed to upper and lower sides of the dielectric film 30, respectively. The electrodes 31a and 31b are connected to wires and the electrode 31b is grounded.

As shown in FIG. 3(a), when the electric power generation element 3 is compressed to expand the dielectric film 30 in the direction parallel with the planes of the electrodes 31a and 31b, the thickness of the dielectric film 30 is reduced so that charges are stored between the electrodes 31a and 31b. When the compressive force is released thereafter, the dielectric film 30 contracts due to the elastic restoring force thereof as shown in FIG. 3(b). Therefore, the film thickness increases. In this case, charges are discharged and electric power is generated.

Here, the electric resistance of the dielectric film 30 is high. Therefore, even when the amount of compression is large, an electric current does not easily flow through the dielectric film 30 so that a large amount of charges are stored between the electrodes 31a and 31 b. For this reason, it is possible to generate a large amount of power. In addition, because an electric current does not easily flow through the dielectric film 30, generation of Joule heat is suppressed. For this reason, there is low possibility that the dielectric film 30 is thermally broken down. Further, the dielectric film 30 does not easily undergo insulation breakdown. Thus, the electric power generation element 3 has excellent durability.

EXAMPLES

The present invention will be next described in more concretely by way of examples.

Production of Dielectric Film

Dielectric Films of Examples 1 to 10

Dielectric films of Examples 1 to 10 were produced from the raw materials that are shown in Table 1. At first, a carboxyl group-containing hydrogenated nitrile rubber (THERBAN (registered trademark) XT8889 manufactured by LANXESS Inc.) and the specified silica were kneaded with a roll kneader to prepare a rubber composition. The thus prepared rubber composition was then dissolved in acetyl acetone. Into the resulting solution, tetrakis(2-ethylhexyloxy) titanium as an organic metal compound was added to be mixed. Here, the acetyl acetone served not only as a solvent for dissolving the carboxyl group-containing hydrogenated nitrile rubber (rubber polymer) but also as a chelating agent for the tetrakis(2-ethylhexyloxy) titanium (metal alkoxide compound). The mixture solution was thereafter applied to a substrate, dried and heated at 150° C. for about 60 minutes to obtain each dielectric film. Each of the dielectric films had a thickness of about 40 μm.

Dielectric Films of Reference Examples 1 and 2

Dielectric films of Reference Examples 1 and 2 were produced from the raw materials that are shown in Table 1.

The dielectric films of Examples 1 to 10 differ from those of Reference Examples 1 and 2 in the presence or absence of silica. At first, a carboxyl group-containing hydrogenated nitrile rubber (same as above) was dissolved in acetyl acetone. Into the resulting solution, tetrakis(2-ethylhexyloxy) titanium was added to be mixed. The mixture solution was thereafter applied to a substrate, dried and heated at 150° C. for about 60 minutes to obtain each dielectric film. Each of the dielectric films had a thickness of about 40 μm.

Dielectric Films of Examples 11 to 16

Dielectric films of Examples 11 to 16 were produced from the raw materials that are shown in Table 2 in the same manner as that for the production of the dielectric films of Examples 1 to 10 except that the kind of inorganic filler was changed. Each of the dielectric films had a thickness of about 40 μm.

Dielectric Films of Examples 17 to 21

Dielectric films of Examples 17 to 21 were produced from the raw materials that are shown in Table 3 in the same manner as that for the production of the dielectric films of Examples 1 to 10 except that a plasticizer was mixed. At first, a carboxyl group-containing hydrogenated nitrile rubber (same as above) and silica (b) that is described hereinafter were kneaded with a roll kneader to prepare a rubber composition. The thus prepared rubber composition was then dissolved in acetyl acetone. Into the resulting solution, tetrakis(2-ethylhexyloxy) titanium and the specified plasticizer were added to be mixed. The mixture solution was thereafter applied to a substrate, dried and heated at 150° C. for about 60 minutes to obtain each dielectric film. Each of the dielectric films had a thickness of about 40 μm.

Dielectric Films of Examples 22 to 25

Dielectric films of Examples 22 to 25 were produced from the raw materials that are shown in Table 4 in the same manner as that for the production of the dielectric films of Examples 1 to 10 except that the kind of the organic metal compound was changed. Each of the dielectric films had a thickness of about 40 μm.

Dielectric Films of Comparative Examples 1 and 2

Dielectric films of Comparative Examples 1 and 2 were produced from the raw materials that are shown in Table 5. At first, the specified raw materials were mixed and dispersed with a roll kneader to prepare a rubber composition. The thus prepared rubber composition was then shaped into a thin sheet, fed into a mold, and subjected to press-crosslinking at 175° C. for about 30 minutes to obtain each dielectric film. Each of the dielectric films had a thickness of about 50 μm.

The kinds and mixing amounts of the raw materials that were used are shown in Table 1 to Table 5. Silica shown in Tables 1, 3 and 4 are as follows.
Silica (a): wet silica "Nipsil (registered trademark) VN3", manufactured by Tosoh Silica Corporation, pH 5.5 to 6.5, specific surface area 240 $m^2/g$
Silica (b): dry silica "AEROSIL (registered trademark) 380", manufactured by Nippon Aerosil Co., Ltd., pH 3.7 to 4.7, specific surface area 380 $m^2/g$
Silica (c): wet silica "Nipsil ER", manufactured by Tosoh Silica Corporation, pH 7 to 8.5, specific surface area 120 $m^2/g$
Raw materials shown in Table 5 are as follows.
Silicone rubber: "DMS-V31" (manufactured by Gelest, Inc.)
Nitrile rubber: "Nipol (registered trademark) 1042" (manufactured by ZEON CORPORATION)
Methyl-H-siloxane: "TSF484" (manufactured by GE Toshiba Silicones Co., Ltd.)
Retarder: "Surfynol (registered trademark) 61" manufactured by Nissin Chemical Industry Co., Ltd.
Platinum catalyst: "SIP6830.0" manufactured by Gelest, Inc.
Vulcanization aid: Zinc Oxide Grade 2 (manufactured by Mitsui Mining & Smelting Co., Ltd)
Stearic acid: "LUNAC (registered trademark) S30" (manufactured by Kao Corporation)
Tetraethylthiuram disulfide: "Sanceler (registered trademark) TET-G" (manufactured by SANSHIN CHEMICAL INDUSTRY CO., LTD.)
N-Cyclohexyl-2-benzothiazyl sulfenamide: "Sanceler (registered trademark) CZ-GS" (manufactured by SANSHIN CHEMICAL INDUSTRY CO., LTD.)
Sulfur: "SULFAX T-10" manufactured by TURUMI CHEMICAL INDUSTRY CO., LID.)

TABLE 1

(parts by mass)

| | Raw materials | Example 1 | Example 2 | Example 3 | Example 4 | Example 5 | Example 6 | Example 7 |
|---|---|---|---|---|---|---|---|---|
| Rubber polymer | Carbixyl group-containing hydrogenated nitrile rubber | 100 | 100 | 100 | 100 | 100 | 100 | 100 |
| Organic metal compound | Tetrakis (2-ethylhexyloxy) titanium | 5 | 15 | 15 | 15 | 15 | 30 | 30 |
| Inorganic filler | Silica (a) [pH 5.5 to 6.5] | 10 | 5 | 10 | 20 | 30 | 10 | 30 |
| | Silica (b) [pH 3.7 to 4.7] | — | — | — | — | — | — | — |
| | Silica (c) [pH 7 to 8.5] | — | — | — | — | — | — | — |
| Solvent | Acetyl acetone (chelating agent) | 643 | 655 | 683 | 740 | 797 | 743 | 857 |
| | Electric resistance of dielectric film [Ω · cm] | $6.0 \times 10^{11}$ | $8.6 \times 10^{11}$ | $1.5 \times 10^{12}$ | $2.5 \times 10^{12}$ | $1.3 \times 10^{12}$ | $5.9 \times 10^{12}$ | $1.7 \times 10^{12}$ |
| | Maximum generated stress of actuator [MPa] | 0.09 | 0.19 | 0.30 | 0.26 | 0.21 | 0.29 | 0.24 |
| | Maximum field strength of actuator [V/μm] | 26 | 43 | 55 | 51 | 37 | 56 | 43 |

| | Raw materials | Example 8 | Example 9 | Example 10 | Rererence Example 1 | Reference Example 2 |
|---|---|---|---|---|---|---|
| Rubber polymer | Carbixyl group-containing hydrogenated nitrile rubber | 100 | 100 | 100 | 100 | 100 |

TABLE 1-continued

|  |  | (parts by mass) | | | | |
| --- | --- | --- | --- | --- | --- | --- |
| Organic metal compound | Tetrakis (2-ethylhexyloxy) titanium | 15 | 30 | 15 | 5 | 15 |
| Inorganic filler | Silica (a) [pH 5.5 to 6.5] | — | — | — | — | — |
|  | Silica (b) [pH 3.7 to 4.7] | 10 | 10 | — | — | — |
|  | Silica (c) [pH 7 to 8.5] | — | — | 10 | — | — |
| Solvent | Acetyl acetone (chelating agent) | 683 | 743 | 683 | 587 | 627 |
| Electric resistance of dielectric film [Ω · cm] | | $4.2 \times 10^{12}$ | $5.9 \times 10^{12}$ | $4.8 \times 10^{11}$ | $2.5 \times 10^{11}$ | $3.8 \times 10^{11}$ |
| Maximum generated stress of actuator [MPa] | | 0.60 | 0.78 | 0.28 | 0.08 | 0.14 |
| Maximum field strength of actuator [V/μm] | | 70 | 80 | 45 | 24 | 40 |

TABLE 2

|  | Raw materials | Example 11 | Example 12 | Example 13 | Example 14 | Example 15 | (parts by mass) Example 16 |
| --- | --- | --- | --- | --- | --- | --- | --- |
| Rubber polymer | Carbixyl group-containing hydrogenated nitrile rubber | 100 | 100 | 100 | 100 | 100 | 100 |
| Organic metal compound | Tetrakis (2-ethylhexyloxy) titanium | 15 | 15 | 15 | 15 | 15 | 15 |
| Inorganic filler | Barium titanate | 10 | — | — | — | — | — |
|  | Calcium carbonate | — | 10 | — | — | — | — |
|  | Tinanium oxide | — | — | 10 | 20 | 40 | — |
|  | Clay | — | — | — | — | — | 10 |
| Solvent | Acetyl acetone (chelating agent) | 683 | 683 | 683 | 683 | 683 | 683 |
| Electric resistance of dielectric film [Ω · cm] | | $4.5 \times 10^{11}$ | $5.1 \times 10^{11}$ | $4.2 \times 10^{11}$ | $5.3 \times 10^{11}$ | $4.0 \times 10^{12}$ | $3.2 \times 10^{12}$ |
| Maximum generated stress of actuator [MPa] | | 0.69 | 0.43 | 0.68 | 0.80 | 0.69 | 0.43 |
| Maximum field strength of actuator [V/μm] | | 75 | 65 | 70 | 75 | 70 | 65 |

TABLE 3

|  | Raw materials | Example 17 | Example 18 | Example 19 | Example 20 | (parts by mass) Example 21 |
| --- | --- | --- | --- | --- | --- | --- |
| Rubber polymer | Carbixyl group-containing hydrogenated nitrile rubber | 95 | 90 | 95 | 95 | 90 |
| Organic metal compound | Tetrakis(2-ethylhexyloxy) titanium | 5 | 10 | 5 | 5 | 10 |
| Inorganic filler | Silica (b) [pH 3.7 to 4.7] | 10 | 10 | 10 | 10 | 10 |
| Plastiizer | Tricresyl phosphate | 25 | 50 | — | — | — |
|  | Tris(2-ethylhexyl) trimellitate | — | — | 25 | — | — |
|  | Chlorinated paraffin | — | — | — | 25 | 50 |
| Solvent | Acetyl acetone (chelating agent) | 806 | 806 | 806 | 806 | 806 |
| Electric resistance of dielectric film [Ω · cm] | | $2.2 \times 10^{12}$ | $1.1 \times 10^{12}$ | $2.9 \times 10^{12}$ | $2.2 \times 10^{12}$ | $5.9 \times 10^{11}$ |
| Maximum generated stress of actuator [MPa] | | 0.23 | 0.31 | 0.22 | 0.23 | 0.45 |
| Maximum field strength of actuator [V/μm] | | 50 | 65 | 50 | 55 | 70 |

TABLE 4

|  | Raw materials | Example 22 | Example 23 | Example 24 | (parts by mass) Example 25 |
| --- | --- | --- | --- | --- | --- |
| Rubber polymer | Carbixyl group-containing hydrogenated nitrile rubber | 100 | 100 | 100 | 100 |
| Organic metal compound | Polyhydroxytitanium stearate | 15 | 30 | — | — |
|  | Titanium butoxide dimer | — | — | 15 | — |
|  | Zirconium tetraacetyl acetonate | — | — | — | 7 |
| Inorganic filler | Silica (b) [pH 3.7 to 4.7] | 10 | 10 | 10 | 10 |
| Solvent | Acetyl acetone (chelating agent) | 683 | 857 | 683 | 651 |
| Electric resistance of dielectric film [Ω · cm] | | $5.7 \times 10^{12}$ | $6.3 \times 10^{12}$ | $2.8 \times 10^{12}$ | $3.2 \times 10^{12}$ |
| Maximum generated stress of actuator [MPa] | | 0.45 | 0.38 | 0.79 | 0.30 |
| Maximum field strength of actuator [V/μm] | | 65 | 55 | 80 | 50 |

TABLE 5

| | Raw materials | Comparative Example 1 | Comparative Example 2 (parts by mass) |
|---|---|---|---|
| Rubber polymer | Silicone rubber | 100 | — |
| Crosslinker | Nitrile rubber | — | 100 |
| Retarder | Methyl-H-siloxane | 1.5 | — |
| Catalyst | Surfynol 61 | 0.03 | — |
| Vulcanization aid | Platinum catalyst | 0.01 | — |
| Processing aid | Zinc oxide grade 2 | — | 5 |
| Accelerator | Steatric acid | — | 1 |
| | Tetraethylthiuram disulfide | — | 2.1 |
| | N-Cyclohexyl-2-benzothiazyl sulfenamide | — | 1 |
| | Sulfur | — | 0.44 |
| Electric resistance of dielectric film [$\Omega \cdot$ cm] | | $8.0 \times 10^{14}$ | $2.0 \times 10^{10}$ |
| Maximum generated stress of actuator [MPa] | | 0.05 | 0.06 |
| Maximum field strength of actuator [V/μm] | | 120 | 18 |

<Measurement of Electric Resistance of Dielectric Films>

The electric resistance of each of the dielectric films of Examples, Reference Examples and Comparative Examples was measured according to JIS K6911(1995). The measurement results are summarized in Table 1 to Table 5. As shown in Table 1 to Table 4, any of the dielectric films of Examples has a high electric resistance, namely has high insulative properties. For example, with reference to Table 1, when comparison is made between dielectric films in which the mixing amount of the metal alkoxide compound is the same, the electric resistance of Example 1 is higher than that of Reference Example 1 and the electric resistances of Examples 2 to 5, 8 and 10 are higher than that of Reference Example 2. Namely, it has been confirmed that the dielectric films of Examples that contain silica (inorganic filler) each have a higher electric resistance as compared with the dielectric films of Reference Examples that do not contain silica. Similarly, when comparison is made between Examples 11 to 16 in Table 2 and Reference Example 2 in which the mixing amount of the metal alkoxide compound is the same, the electric resistance of Examples 11 to 16 is higher than that of Reference Example 2. Namely, it has been confirmed that, irrespective of the kind of inorganic filler, the dielectric films of Examples that contain an inorganic filler each have a higher electric resistance as compared with the dielectric films of Reference Examples that do not contain an inorganic filler. In addition, each of the dielectric films of Examples 17 to 21 in which a plasticizer was mixed has high electric resistance. Incidentally, it is seen that the electric resistance of the dielectric film in which the conventional silicone rubber is used (Comparative Example 1) is high while the electric resistance of the dielectric film in which nitrile rubber is used (Comparative Example 2) is low, as shown Table 5.

The relationship between the pH value of silica and the electric resistance will be next considered. When Examples 3, 8 and 10, for example, are compared, it is seen that the electric resistance increases in the order of Example 10, Example 3 and Example 8. This tendency is in conformity with the decrease of the pH value of silica. Namely, the pH value of the silica in these examples decreases in the order of Example 10, Example 3 and Example 8. That is to say, the lower the pH value of silica (the stronger the acidity of silica), the higher the electric resistance.

The relationship between the mixing amount of silica and the electric resistance will be next considered. When Examples 2 to 4, for example, are compared, the electric resistance increased with an increase of the mixing amount of silica (in the order of Example 2, Example 3 and Example 4). Incidentally, no additional increase in the electric resistance was observed in Example 5 in which the mixing amount of silica is the largest (30 parts by mass), in contrast to Example 4 (20 parts by mass) and Example 3 (10 parts by mass). The reason for this is considered that the insulation effect attained by the addition of silica became saturated.

<Evaluation of Actuators>

Actuators were next prepared using each of the dielectric films of Examples, Reference Examples and Comparative Examples and their maximum generated stresses and maximum field strengths were measured. Description will be first made of an experiment device and an experiment method.

Actuators were prepared by bonding an electrode formed by a mixture of an acrylic rubber with carbon black to each of the front and back surfaces of each of the dielectric films of Examples, Reference Examples and Comparative Examples. The prepared actuators will be hereinafter referred to as "actuators of Examples", etc. in correspondence with the types of the dielectric films. A front view of an actuator mounted to an experiment device is shown in FIG. 4. FIG. 5 is a V-V sectional view of FIG. 4.

As shown in FIG. 4 and FIG. 5, an upper end of an actuator 5 is held by an upper chuck 52, while a lower end of the actuator 5 is held by a lower chuck 53. The actuator 5 is mounted between the upper chuck 52 and the lower chuck 53 in the state where the film is stretched in the upper-lower direction beforehand (stretching rate: 25%). A load cell (not shown) is disposed above the upper chuck 52.

The actuator 5 includes a dielectric film 50 and a pair of electrodes 51a and 51b. The dielectric film 50 in a free state is a rectangular film that is 50 mm long, 25 mm wide and about 40 μm thick. The electrodes 51a and 51b are arranged so as to face each other with the dielectric film 50 being sandwiched therebetween. Each of the electrodes 51a and 51b in a free state is a rectangular film that is 40 mm long, 25 mm wide and about 10 μm thick. The electrodes 51a and 51b are arranged in the state where they are offset by 10 mm in the upper-lower direction. Namely, the electrodes 51a and 51b overlap with each other through the dielectric film 50 over the area of 30 mm length and 25 mm width. A wire (not shown) is connected to a lower end of the electrode 51a. Similarly, a wire (not shown) is connected to an upper end of the electrode 51b. The electrodes 51a and 51b are connected to a power source (not shown) through the wires.

When a voltage is applied between the electrodes 51a and 51b, electrostatic attractive force is generated between the electrodes 51a and 51b so that the dielectric film 50 is compressed. As a result, the thickness of the dielectric film 50 decreases and the dielectric film 50 expands in the stretching direction (upper-lower direction). The expansion of the dielectric film 50 causes a decrease of the stretching force in the upper-lower direction. The reduction of the stretching force before and after the application of the voltage, which was measured by the load cell, represents a generated stress. The measurement of the generated stress was continued while increasing the applied voltage stepwise until the dielectric film 50 was broken down. The generated stress just before the breakage of the dielectric film 50 represents the maximum generated stress. The value obtained by dividing the voltage at that time by the thickness of the dielectric film 50 represents the maximum field strength. The measurement results of the maximum generated stress and maximum field strength of each of the actuators of Examples, Reference Examples and Comparative Examples are summarized in Table 1 to Table 5.

As shown in Table 1 to Table 4, the maximum generated stresses of the actuators of Examples are larger than those of the actuators of Comparative Examples. It is also seen that the generated stress of the actuator of Comparative Example 1 in which the dielectric film made of a silicone rubber is used is small, though the maximum field strength is very high. When comparison is made between actuators in which the mixing amount of the metal alkoxide compound is the same, the maximum generated stress of Example 1 is larger than that of Reference Example 1 and the maximum generated stresses of Examples 2 to 5, 8 and 10 are larger than that of Reference Example 2. Similarly, when comparison is made between Examples 11 to 16 in Table 2 and Reference Example 2 in which the mixing amount of the metal alkoxide compound is the same, the maximum generated stresses of Examples 11 to 16 are larger than that of Reference Example 2. The maximum generated stress is also large in Examples 17 to 21 in which a plasticizer is used.

As described above, the electric resistances of the dielectric films of Examples are high. Therefore, the actuators of Examples can store a large amount of charges. Further, the dielectric films each also have high resistance to insulation breakdown, so that breakage by Joule heat can be suppressed. Therefore, it is possible to apply a high voltage to the actuators of Examples. It is considered that the actuators of Examples could output large force for the above reasons.

As described above, when Examples 3, 8 and 10 are compared, there is seen a tendency that the lower the pH value of silica, the higher the electric resistance. Similar to the tendency of the electric resistance, the maximum generated stress and the maximum filed strength increase in the order of Example 10, Example 3 and Example 8.

INDUSTRIAL APPLICABILITY

The dielectric film of the present invention may be widely used in transducers such as actuators, sensors, electric power generation elements, etc. that perform conversion between mechanical energy and electrical energy, as well as speakers, microphones, noise cancellers etc. that perform conversion between acoustic energy and electrical energy. Among them, the dielectric film is suited for flexible actuators that are used, for example, in artificial muscle for industrial, medical or rehabilitation robots; in small pumps that are used for, for example, electronic part coolers and medical purposes; and in medical instruments.

The invention claimed is:
1. A process for producing a dielectric film, the dielectric film is to be interposed between at least a pair of electrodes of a transducer and comprises a three-dimensional crosslinked body formed by reacting the following components:
an organic metal compound,
a rubber polymer that is other than a polydimethyl siloxane and has a functional group that is reactive with the organic metal compound, and
an inorganic filler that has a functional group that is reactive with the organic metal compound,
the process comprising:
preparing a first solution that contains the rubber polymer and the inorganic filler in a solvent that is capable of dissolving the rubber polymer and of chelating the organic metal compound,
preparing a second solution by mixing the organic metal compound into the first solution, and
removing the solvent from the second solution to allow a crosslinking reaction to proceed.
2. The process for producing a dielectric film according to claim 1, wherein the organic metal compound is at least one compound selected from the group consisting of metal alkoxide compounds, metal acylate compounds and metal chelate compounds.
3. The process for producing a dielectric film according to claim 1, wherein the functional group of the rubber polymer is at least one group selected from the group consisting of a carboxyl group, a hydroxyl group, an amino group, an amide, an epoxy group, a thiol and an ester.
4. The process for producing a dielectric film according to claim 1, wherein the rubber polymer is at least one polymer selected from the group consisting of acrylonitrile-butadiene copolymers, hydrogenated nitrile rubbers, acrylic rubbers, urethane rubbers, fluorine rubbers, fluorosilicone rubbers, chlorosulfonated polyethylene rubbers, chloroprene rubbers, ethylene-vinyl acetate copolymers and chlorinated polyethylenes.
5. The process for producing a dielectric film according to claim 1, wherein the organic metal compound contains at least one element selected from the group consisting of titanium, zirconium, aluminum, silicon, boron, vanadium, manganese, iron, cobalt, germanium, yttrium, niobium, lanthanum, cerium, tantalum, tungsten and magnesium.
6. The process for producing a dielectric film according to claim 1, wherein the three-dimensional crosslinked body is synthesized from a composition that includes a plasticizer in addition to the organic metal compound, the rubber polymer and the inorganic filler,
at least one of the first solution and the second solution contains the plasticizer.
7. The process for producing a dielectric film according to claim 1, wherein the solvent is acetyl acetone.
8. The process for producing a dielectric film according to claim 1, wherein a mixing amount of the organic metal compound is 0.5 part by mass or more and 30 parts by mass or less per 100 parts by mass of the rubber polymer.
9. The process for producing a dielectric film according to claim 1, wherein a mixing amount of the inorganic filler is 1 part by mass or more and 30 parts by mass or less per 100 parts by mass of the rubber polymer.
10. The process for producing a dielectric film according to claim 1, wherein the organic metal compound is at least one compound selected from the group consisting of tetrakis (2-ethylhexyloxy) titanium, polyhydroxy titanium stearate, titanium butoxide dimer and zirconium tetraacetyl acetonate.
11. The process for producing a dielectric film according to claim 1, wherein removing the solvent from the second solution to allow a crosslinking reaction to proceed comprises applying the second solution to a substrate and heating the second solution at a temperature that is not lower than the boiling point of the solvent.

12. The process for producing a dielectric film according to claim 1, wherein
the organic metal compound is a metal alkoxide compound,
the functional group of the rubber polymer is a carboxyl group,
the process further comprising:
kneading the rubber polymer and the inorganic filler with a roll kneader to obtain a kneaded mixture before preparing the first solution and
preparing the first solution by adding the kneaded mixture to the solvent.

13. The process for producing a dielectric film according to claim 1, wherein
the organic metal compound is a metal alkoxide compound,
the functional group of the rubber polymer is a carboxyl group,
the inorganic filler is silica,
the process further comprising:
kneading the rubber polymer and the inorganic filler with a roll kneader to obtain a kneaded mixture before preparing the first solution and
preparing the first solution by adding the kneaded mixture to the solvent.

14. The process for producing a dielectric film according to claim 1, wherein the inorganic filler is silica.

15. The process for producing a dielectric film according to claim 14, wherein the silica has a pH of 8.5 or less.

16. The process for producing a dielectric film according to claim 1, further comprising:
kneading the rubber polymer and the inorganic filler to obtain a kneaded mixture before preparing the first solution and
preparing the first solution by adding the kneaded mixture to the solvent.

17. The process for producing a dielectric film according to claim 16, wherein
the rubber polymer and the inorganic filler are kneaded with a roll kneader.

* * * * *